(12) United States Patent
Bilenko et al.

(10) Patent No.: US 8,030,575 B2
(45) Date of Patent: Oct. 4, 2011

(54) MOUNTING STRUCTURE PROVIDING ELECTRICAL SURGE PROTECTION

(75) Inventors: Yuriy Bilenko, Columbia, SC (US);
Remigijus Gaska, Columbia, SC (US);
Michael Shur, Latham, NY (US);
Grigory Simin, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 252 days.

(21) Appl. No.: 11/465,241

(22) Filed: Aug. 17, 2006

(65) Prior Publication Data
US 2007/0151755 A1    Jul. 5, 2007

Related U.S. Application Data

(60) Provisional application No. 60/754,992, filed on Dec. 29, 2005.

(51) Int. Cl.
*H05K 1/03*    (2006.01)

(52) U.S. Cl. ......... 174/255; 174/256; 361/760; 361/767

(58) Field of Classification Search .......... 174/261, 174/260, 250, 255, 257, 256, 557; 361/767, 361/766, 760, 764, 763, 762, 779, 782, 783, 361/5–9, 15, 17–19, 748, 806–812, 752
See application file for complete search history.

(56) References Cited

U.S. PATENT DOCUMENTS

| | | | | |
|---|---|---|---|---|
| 2,791,758 A * | 5/1957 | Looney | .......... | 365/184 |
| 5,260,848 A * | 11/1993 | Childers | .......... | 361/127 |
| 5,278,535 A * | 1/1994 | Xu et al. | .......... | 338/20 |
| 5,345,134 A * | 9/1994 | Greer | .......... | 310/313 D |
| 5,476,714 A * | 12/1995 | Hyatt | .......... | 428/402 |
| 5,811,330 A * | 9/1998 | Kalnitsky | .......... | 438/238 |
| 5,953,194 A * | 9/1999 | Atkins | .......... | 361/119 |
| 6,472,688 B2 | 10/2002 | Miyata | | |
| 6,486,499 B1 | 11/2002 | Krames et al. | | |
| 6,549,114 B2 * | 4/2003 | Whitney et al. | .......... | 338/21 |
| 6,657,532 B1 * | 12/2003 | Shrier et al. | .......... | 338/21 |
| 7,015,583 B2 | 3/2006 | Ishii et al. | | |
| 7,202,770 B2 * | 4/2007 | Harris et al. | .......... | 338/21 |
| 2001/0020705 A1 | 9/2001 | Miyata | | |

(Continued)

FOREIGN PATENT DOCUMENTS

| | | |
|---|---|---|
| JP | 2001244506 A | 9/2001 |
| TW | 200419825 | 10/2004 |
| TW | 200524131 | 7/2005 |

OTHER PUBLICATIONS

PCT International Search Report and Written Opinion; Jul. 7, 2008; 10 pages.

(Continued)

*Primary Examiner* — Hoa C. Nguyen
(74) *Attorney, Agent, or Firm* — John W. LaBatt; Hoffman Warnick LLC

(57) ABSTRACT

A solution for protecting an electronic device from an electrical surge using a mounting structure is provided. In particular, the mounting structure comprises a conductive material and is electrically connected to the protected electrical device. The conductive material and/or mounting structure can have one or more properties that prevent the mounting structure from adversely impacting operation of the electronic device during normal operation, but enables the mounting structure to provide an alternative electrical path during the electrical surge.

23 Claims, 7 Drawing Sheets

U.S. PATENT DOCUMENTS

| | | | |
|---|---|---|---|
| 2002/0028527 A1* | 3/2002 | Maeda et al. | 438/29 |
| 2003/0079910 A1* | 5/2003 | Kosowsky | 174/260 |
| 2005/0023575 A1* | 2/2005 | Wu et al. | 257/256 |
| 2005/0083163 A1* | 4/2005 | Shrier | 337/16 |
| 2005/0247944 A1* | 11/2005 | Haque et al. | 257/79 |
| 2005/0286198 A1* | 12/2005 | Anthony et al. | 361/118 |
| 2006/0012997 A1* | 1/2006 | Catalano et al. | 362/253 |
| 2006/0055012 A1* | 3/2006 | Hsin Chen et al. | 257/678 |
| 2006/0118775 A1* | 6/2006 | Nagai et al. | 257/13 |

OTHER PUBLICATIONS

Taiwan Office Action, Taiwanese Application No. 095149295, Office Action Dated Dec. 18, 2009, Translated Version of Examiner's Opinion (provided), 6 pages.

KIPO, Korean Office Action Summary, Korean Application No. 10-2008-7018076, Notification of Provisional Rejection, Dated Jun. 30, 2010, 2 pages.

KIPO, Korean Office Action Summary, Korean Application No. 10-2008-7018076, Final Notification of Provisional Rejection, Dated Jan. 31, 2011, 1 page.

Taiwan Office Action, Taiwanese Application No. 095149295, Issuance Date Nov. 19, 2010, (translation provided), 5 pages.

Japanese Office Action, Japanese Application No. P2008-548501, Dispatch Date Jan. 25, 2011, (translation provided), 4 pages.

Taiwan Office Action, Taiwanese Application No. 095149295, Issuance Date Mar. 4, 2011, (translation in copy provided), 10 pages.

* cited by examiner

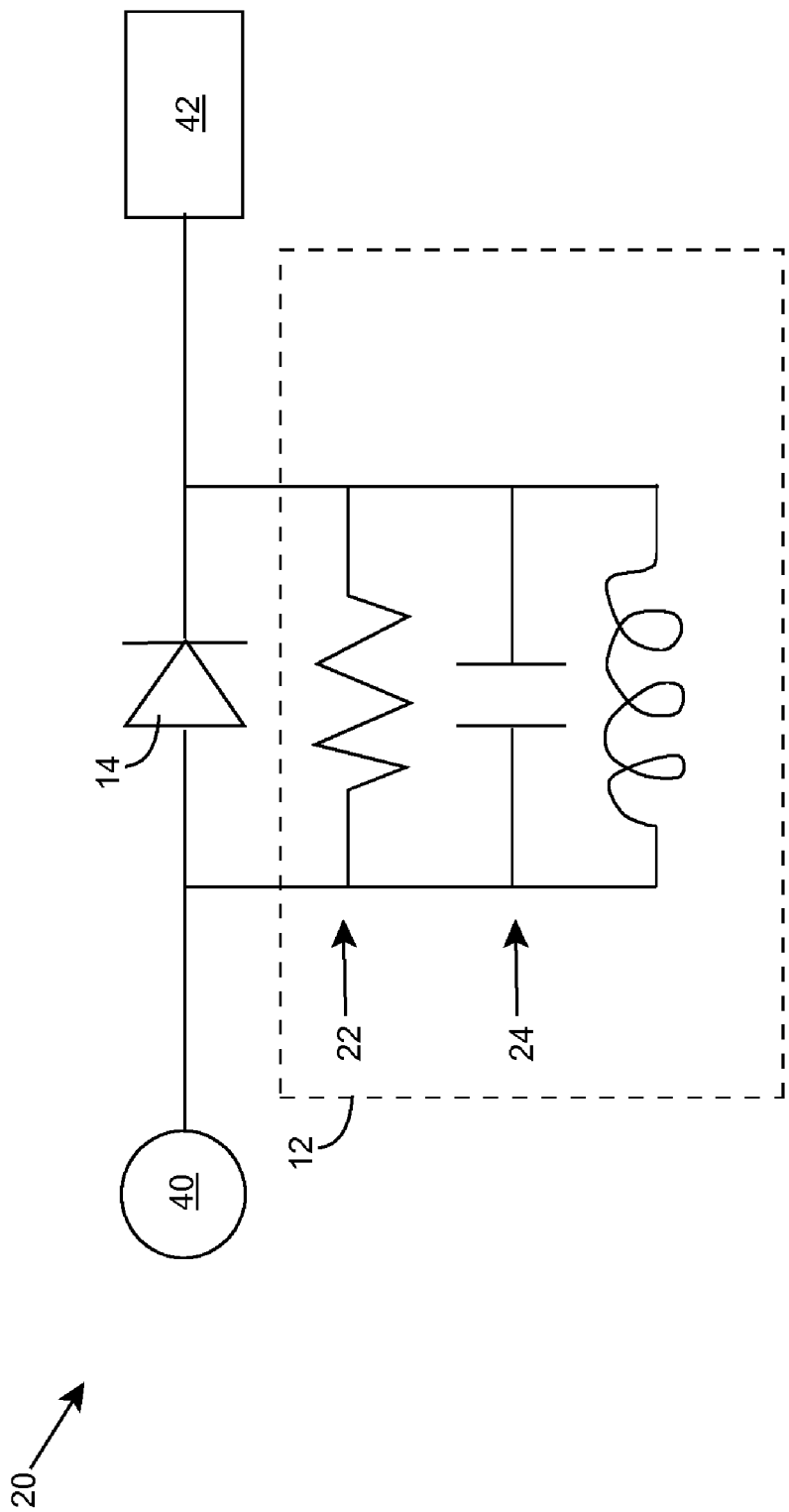

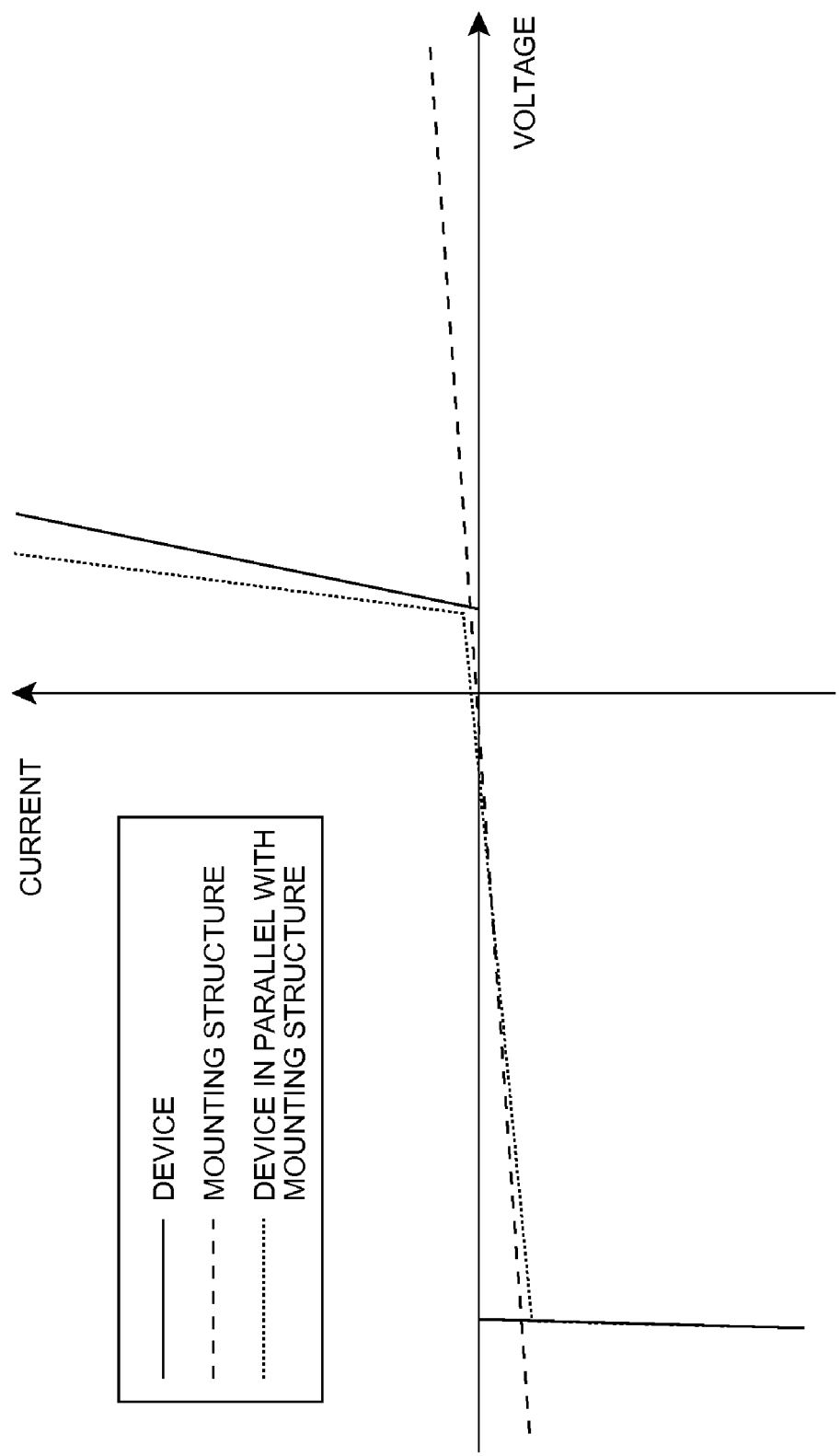

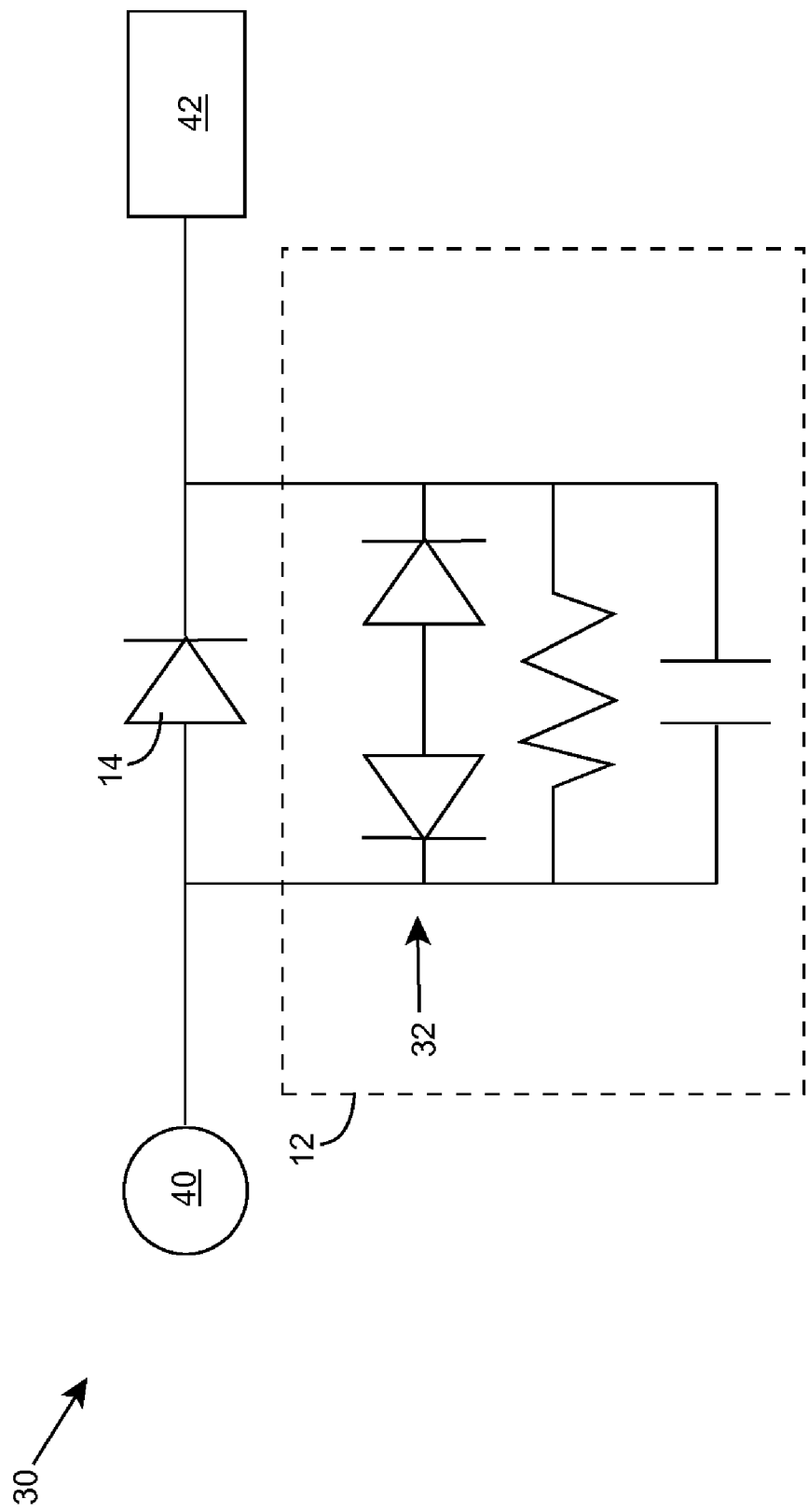

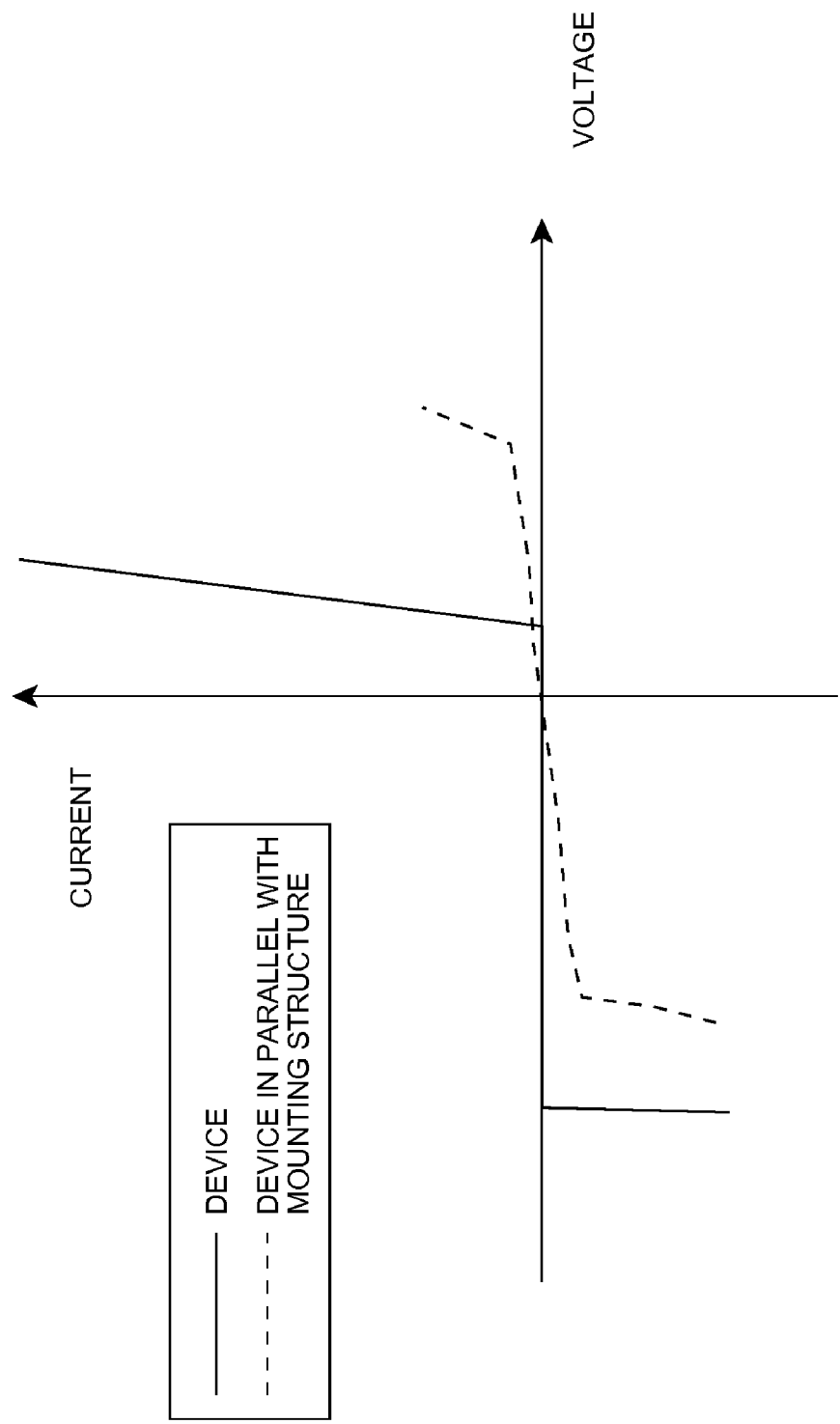

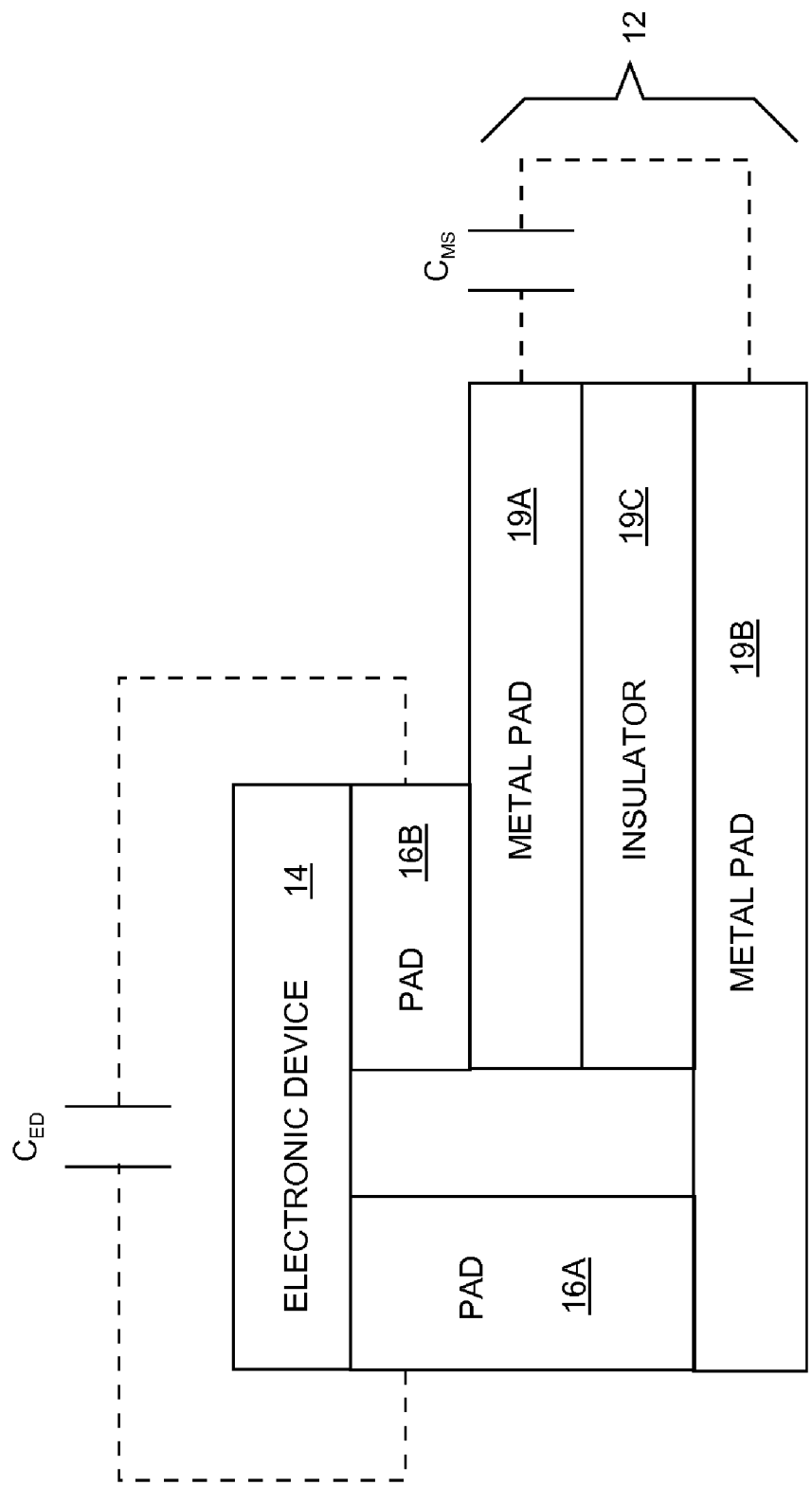

MOUNTING STRUCTURE PROVIDING ELECTRICAL SURGE PROTECTION

CROSS-REFERENCE TO RELATED APPLICATION

The current application claims the benefit of co-pending U.S. Provisional Application No. 60/754,992, filed on Dec. 29, 2005, which is hereby incorporated herein by reference.

FIELD OF THE INVENTION

The invention relates generally to electronic devices, and more particularly, to a mounting structure that protects an electronic device from an electrical surge.

BACKGROUND OF THE INVENTION

Electric surges and/or electrostatic discharges through an electronic device can cause a failure of the electronic device. As a result, electronic circuits frequently include protection circuitry that prevents many electric surges and electrostatic discharges from harming the electronic device(s). Typically, a diode, such as a Zener diode, a p-i-n diode, or a Schottky diode is included in the electronic circuit to protect other more sensitive electronic device(s). However, this solution requires additional circuit elements, thereby increasing the cost and complexity of the electronic circuit.

In an electronic circuit, an electronic device is often mounted on a submount. Typically, the submount will have good thermal conductivity to provide for efficient heat removal, thereby avoiding overheating and subsequent failure of the electronic device. The submount can include contact pads that are electrically connected to the contact(s) of the electronic device using bonded wires. To this extent, the submount typically comprises a non-conducting (i.e., insulating) material to avoid shorting two or more electronic device contacts. To date, submounts are not used to provide protection from electric surges, electrostatic discharges, and/or the like for electronic devices.

In view of the foregoing, a need exists to overcome one or more of the deficiencies in the related art.

BRIEF SUMMARY OF THE INVENTION

The invention provides a solution for protecting an electronic device from an electrical surge using a mounting structure. In particular, the mounting structure comprises a conductive material and is electrically connected to the protected electrical device. The conductive material and/or mounting structure can have one or more properties that prevent the mounting structure from adversely impacting operation of the electronic device during normal operation, but enables the mounting structure to provide an alternative electrical path during the electrical surge. In this manner, the electronic device can be protected from the electrical surge without use of additional circuit elements.

A first aspect of the invention provides an electrical circuit comprising: an electronic device; and a mounting structure comprising a conductive material and having an electrical connection to the electronic device, the mounting structure protecting the electronic device from an electrical surge.

A second aspect of the invention provides a mounting structure for an electronic device comprising: a submount comprising a conductive material; and means for electrically connecting the submount to the electronic device, wherein the submount is configured to protect the electrically connected electronic device from an electrical surge.

A third aspect of the invention provides a method of manufacturing an electrical circuit, the method comprising: obtaining a mounting structure comprising a conductive material; and electrically connecting an electronic device to the mounting structure, wherein the mounting structure protects the electronic device from an electrical surge.

The illustrative aspects of the present invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention.

FIG. 3 shows an illustrative equivalent circuit diagram of the electrical circuit of FIG. 1 according to an embodiment of the invention.

FIG. 4 shows illustrative schematic current-voltage characteristics of an active electronic device, a mounting structure, and the combined electronic device and mounting structure according to an embodiment of the invention FIG. 5 shows an illustrative equivalent circuit diagram of the electrical circuit of FIG. 1 according to another embodiment of the invention.

FIG. 6 shows illustrative schematic current-voltage characteristics of an active electronic device and the electronic device combined with a mounting structure according to an embodiment of the invention.

FIG. 7 shows another illustrative configuration of an electronic device and a mounting structure according to an embodiment of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the invention provides a solution for protecting an electronic device from an electrical surge using a mounting structure. In particular, the mounting structure comprises a conductive material and is electrically connected to the protected electrical device. The conductive material and/or mounting structure can have one or more properties that prevent the mounting structure from adversely impacting operation of the electronic device during normal operation, but enables the mounting structure to provide an alternative electrical path during the electrical surge. In this manner, the electronic device can be protected from the electrical surge without use of additional circuit elements. As used herein, unless otherwise noted, the term "set" means one or more (i.e., at least one) and the phrase "any solution" means any now known or later developed solution.

Figure 1:
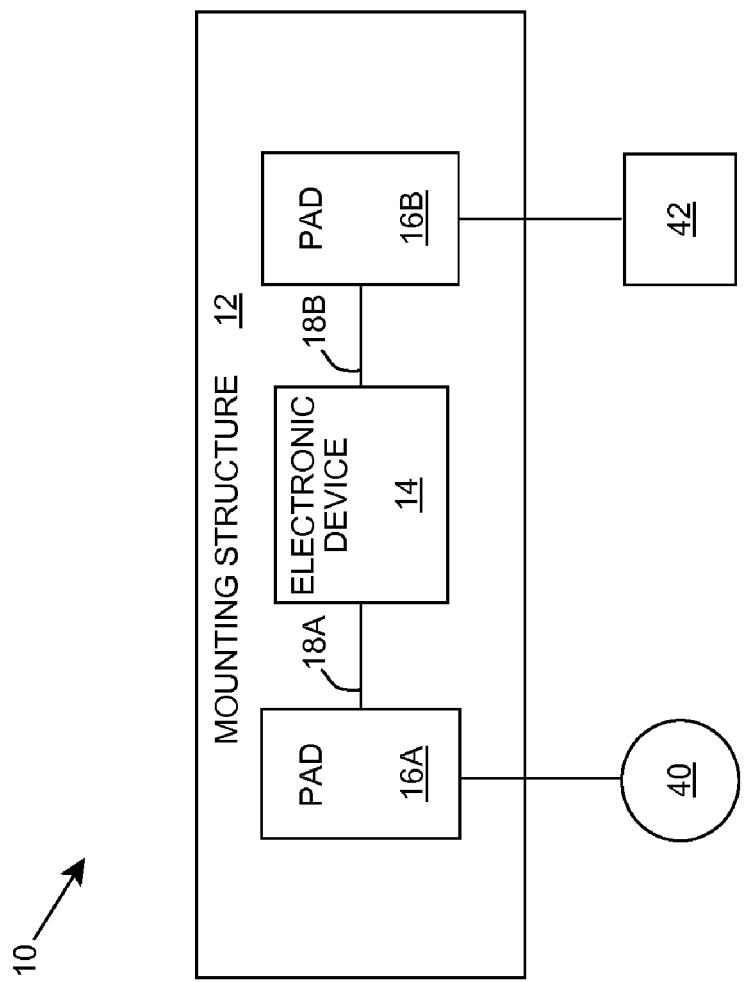
FIG. 1 shows an illustrative electrical circuit according to an embodiment of the invention.

Turning to the drawings, FIG. 1 shows an illustrative electrical circuit 10 according to an embodiment of the invention.

Electrical circuit 10 includes a mounting structure 12 and an electronic device 14. Mounting structure 12 includes a set of contact pads 16A-B, which can be connected to electrical contact(s) for electronic device 14 using bonded wires 18A-B, respectively. Contact pads 16A-B and bonded wires 18A-B electrically connect mounting structure 12 to electronic device 14 in a parallel manner. While a single electronic device 14 is shown and described herein, it is understood that multiple electronic devices 14 can be electrically connected to mounting structure 12 in parallel, series, and/or separate electrical circuits. Additionally, while electronic device 14 is shown having two electrical contacts and mounting structure 12 is shown having two pads 16A-B, it is understood that any number of contacts and/or contact pads 16A-B may be included. Regardless, pads 16A-B can be used to electrically connect electronic device 14 (and therefore mounting structure 12) with one or more additional electronic devices 42 using any solution. Similarly, electronic device 14 (and therefore mounting structure 12) can be electrically connected to a power source 40 using any solution.

Electronic device 14 can comprise any type of electronic device. In one embodiment, electronic device 14 comprises an electronic device, such as a power semiconductor device, having two states: an on state when the device current is high; and an off state when the device current is low. In this case, electronic device 14 can have a non-linear resistance that is smaller for a forward voltage bias than for a negative voltage bias. To this extent, electronic device 14 can comprise a semiconductor diode, a p-n junction diode, a Schottky diode, a light emitting diode (LED), a laser, a switching transistor, and/or the like. For example, electronic device 14 can comprise a deep ultraviolet LED having a reverse resistance of approximately one GigaOhm (GOhm) and a minimal required resistance as low as five MegaOhms (MOhm).

In any event, mounting structure 12 protects electronic device 14 from an electrical surge, such as an electric power surge, an electrostatic discharge, and/or the like. To this extent, mounting structure 12 can comprise a conductive material. In an embodiment, the conductive material comprises a slightly conductive material that provides a parallel leakage path for electronic device 14. For example, the conductive material can comprise a semi-insulating silicon carbide (SiC), which can be used with, for example, the deep ultraviolet LED described above. In this case, the SiC can comprise any of various polytypes of SiC, such as 4H—SiC, 6H—SiC, 3C—SiC, high purity SiC, and/or the like. It is understood that mounting structure 12 can comprise other types of conductive materials. For example, mounting structure 12 can comprise a group-III (including aluminum (Al), gallium (Ga), indium (In), etc.) nitride conductive material. In this case, the group-III nitride can comprise $Al_XGa_YIn_ZN$ where $0>=X, Y, Z<=1$ and $X+Y+Z=1$, e.g., (high Al content) AlGaN, AlN, AlGaInN, and/or the like. Further, the conductive material can comprise other types of conductive materials, such as zinc oxide (ZnO) or the like. Still further, the conductive material can be: doped with, for example, Silicon, Carbon, Iron, Boron, Magnesium, Manganese, or the like; compensated (e.g., include both donor and acceptor dopant atoms); can comprise a high temperature conductive material such as SiC; and/or the like.

Figure 2:
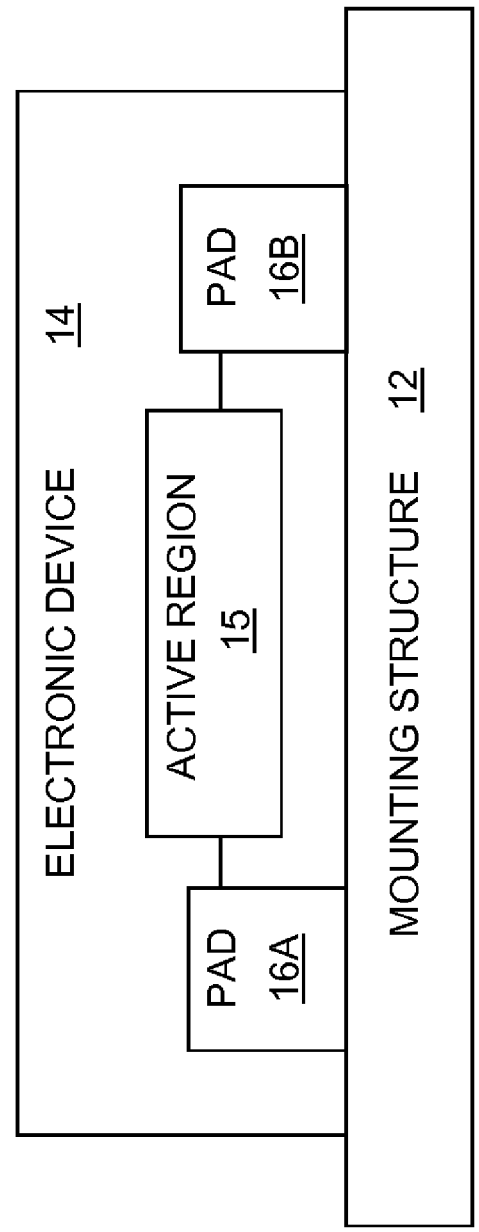
FIG. 2 shows an alternative configuration of an illustrative mounting structure and electronic device according to an embodiment of the invention.

FIG. 2 shows an alternative configuration of mounting structure 12 and electronic device 14 according to an embodiment of the invention. In this case, contact pads 16A-B comprise a portion of electronic device 14 and are electrically connected with an active region 15 of electronic device 14. It is understood that these configurations are only illustrative, and various alternative configurations can be implemented.

FIG. 3 shows an illustrative equivalent circuit diagram 20 for electrical circuit 10 (FIG. 1) according to an embodiment of the invention, in which a diode is used as an illustrative electronic device 14. In this case, the conductive material for mounting structure 12 is selected such that it has intrinsic materials properties that provide, at a nominal forward current (e.g., electronic device 14 is in the on state), an ohmic resistance 22 that is much higher than a working ohmic resistance of electronic device 14. However, the conductive material provides, at a nominal reverse current (e.g., electronic device 14 is in the off state), an ohmic resistance 22 that is less than or equal to a minimum reverse ohmic resistance of electronic device 14. Similarly, mounting structure 12 can comprise an impedance having a similar relationship to the impedance of electronic device 14 as described with respect to the resistance.

In this manner, mounting structure 12 acts as a leaky parallel resistor 22 and does not adversely impact electronic device 14 under normal operations. However, mounting structure 12 provides a parallel leakage path that can reduce the possibility of a failure of electronic device 14 when it is reverse biased and is subjected to a transient spike. In particular, mounting structure 12 will divert some or all of the transient spike away from electronic device 14 due to its comparable/lower ohmic resistance (impedance), thereby decreasing the transient current through electronic device 14.

FIG. 4 shows illustrative schematic current-voltage characteristics of an active electronic device 14 (FIG. 1), a mounting structure 12 (FIG. 1) that is electrically connected in parallel with electronic device 14, and the combined electronic device 14 and mounting structure 12 according to an embodiment of the invention, which illustrates the ohmic resistance and/or impedance relationship between electronic device 14 and mounting structure 12. As shown, mounting structure 12 can be represented as a leaky parallel resistor 22 (FIG. 3) having a quasi-linear current-voltage characteristic.

Mounting structure 12 (FIG. 1) also can have a breakdown voltage that is smaller than a breakdown voltage of the set of active device layers for electronic device 14. To this extent, FIG. 5 shows an illustrative equivalent circuit diagram 30 of electrical circuit 10 (FIG. 1) when mounting structure 12 has such a breakdown voltage according to another embodiment of the invention. Further, FIG. 6 shows illustrative schematic current-voltage characteristics of an active electronic device 14 (FIG. 1) and an electronic device 14 combined with a mounting structure 12 (FIG. 1) that is electrically connected in parallel with electronic device 14 according to an embodiment of the invention, which illustrates the voltage breakdown relationship between electronic device 14 and mounting structure 12. The voltage breakdown relationship can further assist in redistributing a transient current present due to an electrical surge away from electronic device 14. Additionally, with contact pads 16A-B being in contact with mounting structure 12, mounting structure 12 can switch in parallel with electronic device 14 to a power source 40 of electronic device 14.

Returning to FIG. 1, mounting structure 12 can include various other properties/features to protect electronic device 14. For example, at a maximum reverse voltage, electronic device 14 can have a capacitance that is smaller than a shunting capacitance 24 (FIG. 3) of mounting structure 12. Additionally, contact pads 18A-B also can be designed and/or located on mounting structure 12 to provide protection to electronic device 14. For example, contact pads 18A-B can be designed and/or located such that a capacitive impedance 24 of pads 18A-B is roughly equivalent or lower than a capacitive impedance of a reverse-biased electronic device 14 (e.g., an LED).

To this extent, FIG. 7 shows another illustrative configuration of electronic device 14 and mounting structure 12 according to an embodiment of the invention. In this case, mounting structure 12 comprises pads 19A-B with an insulator 19C there between. Contact pads 16A-B comprise the plates of an equivalent capacitor, $C_{MS}$, between metal pads 19A-B and across mounting structure 12. To this extent, a capacitance of $C_{MS}$ can be represented as $\in S/d$, where $\in$ is the dielectric constant of a material of insulator 19C (e.g., a dielectric), d is the thickness of insulator 19C, and S is an overlapping area of the contacts of mounting structure 12. As a result, S can be selected in such a manner that $C_{MS}$ exceeds a capacitance, $C_{ED}$, of electronic device 14.

Further, mounting structure 12 also can dissipate thermal energy from electronic device 14. To this extent, mounting structure 12 can comprise a conductive material (e.g., high purity SiC material(s)) that provides good thermal conductivity to efficiently remove heat from electronic device 14, thereby avoiding failure of electronic device 14 due to overheating.

Still further, mounting structure 12 can include a reflective surface adjacent to electronic device 14. In particular, electronic device 14 can comprise a light emitter, such as an LED, laser, or the like. In this case, mounting structure 12 can include a reflective surface that provides improved collection of the light emitted by electronic device 14. The reflective surface of mounting structure 12 can be implemented using any solution. For example, the surface of mounting structure 12 can be polished, the conductive material can be coated with a reflective material such as Aluminum, Titanium dioxide ($TiO_2$), and/or the like.

It is understood that mounting structure 12 can comprise any combination of one or more of the properties/features discussed herein. Regardless, mounting structure 12 can comprise any appropriate mounting structure for implementing the present invention. For example, mounting structure 12 can comprise a submount, a package for electronic device 14, and/or the like. Further, mounting structure 12 can comprise a protective material that is monolithically integrated with electronic device 14, e.g., electrical circuit 10 can comprise a monolithic integrated circuit (IC). Regardless, electrical circuit 10 can be implemented as part of a larger circuit and/or packaged as a unit for installation in a circuit, such as a flip-chip packaged device.

The invention further provides a method of manufacturing electrical circuit 10. In particular, mounting structure 12 comprising a conductive material can be obtained using any solution. For example, a mounting structure 12 having any of combination of the properties/features described herein can be purchased, manufactured using any solution used to manufacture a submount, a package, and/or the like, etc. In any event, electronic device 14 can be electrically connected to mounting structure 12 using any solution (e.g., pads 16A-B and bonded wires 18A-B). Further, mounting structure 12 and electronic device 14 can be electrically connected to other elements of electrical circuit 10, such as power source 40, additional electronic device(s) 42, and/or the like, using any solution.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An electrical circuit comprising:
   an electronic device; and
   a mounting structure having a substantially constant resistance over a voltage range including: an operating voltage range for the electronic device and a voltage present across the electronic device due to an electrical surge, the mounting structure comprising:
      a bulk conductive semiconductor material having a substantially constant resistance over the voltage range; and
      an electrical connection to the electronic device, wherein the bulk conductive semiconductor material is distinct from the electrical connection, the mounting structure protecting the electronic device from the electrical surge without use of any circuit elements selected from the group consisting of: diodes, capacitors, inductors, and resistors for the protection.

2. The electrical circuit of claim 1, further comprising a power source, wherein the mounting structure is connected in parallel with the electronic device to the power source.

3. The electrical circuit of claim 1, wherein, at a nominal forward current, an ohmic resistance of the mounting structure is greater than an ohmic resistance of the electronic device, and wherein, at a nominal reverse current, an ohmic resistance of the mounting structure is less than or equal to a minimum reverse ohmic resistance of the electronic device.

4. The electrical circuit of claim 1, wherein, at a maximum reverse voltage, a capacitance of the electronic device is smaller than a capacitance of the mounting structure.

5. The electrical circuit of claim 1, wherein the bulk conductive semiconductor material comprises a high temperature conductive semiconductor material.

6. The electrical circuit of claim 1, wherein a breakdown voltage of the mounting structure is smaller than a breakdown voltage of a set of active device layers of the electronic device.

7. The electrical circuit of claim 1, wherein the mounting structure dissipates thermal energy from the electronic device.

8. The electrical circuit of claim 1, wherein the electronic device comprises one of the group consisting of: a semiconductor diode, a light emitting diode, a laser, a Schottky diode, and a switching transistor.

9. The electrical circuit of claim 1, wherein the bulk conductive semiconductor material comprises one of the group consisting of: a semi-insulating silicon carbide, a group-III nitride, and zinc oxide.

10. The electrical circuit of claim 1, wherein the bulk conductive semiconductor material is doped.

11. The electrical circuit of claim 1, wherein the bulk conductive semiconductor material is compensated.

12. The electrical circuit of claim 1, wherein the mounting structure includes a reflective surface.

13. A mounting structure for an electronic device comprising:
   a submount having a substantially constant resistance over a voltage range including: an operating voltage range for the electronic device and a voltage present across the electronic device due to an electrical surge, the submount comprising a bulk conductive semiconductor material having a substantially constant resistance over the voltage range and at least one of: a resistance, an impedance, or a capacitance that is larger than a corresponding at least one of: a resistance, an impedance, or a capacitance for the electronic device at a nominal forward current and is smaller than the corresponding at least one of: the resistance, the impedance, or the capacitance for the electronic device at a nominal reverse current; and means for electrically connecting the submount to the electronic device, wherein the bulk conductive semiconductor material is distinct from the means for electrically connecting, and wherein the submount protects the electrically connected electronic device from the electrical surge without use of any circuit elements selected from the group consisting of: diodes, capacitors, inductors, and resistors for the protection.

14. The mounting structure of claim 13, further comprising means for electrically connecting the submount to a power supply, wherein the submount is connected in parallel with the electronic device to the power supply.

15. The mounting structure of claim 13, wherein the bulk conductive semiconductor material comprises one of the group consisting of: a semi-insulating silicon carbide, a group-III nitride, and zinc oxide.

16. The mounting structure of claim 13, wherein the bulk conductive semiconductor material is doped.

17. The mounting structure of claim 13, wherein the bulk conductive semiconductor material is compensated.

18. The mounting structure of claim 13, wherein the submount dissipates thermal energy from the electronic device.

19. The mounting structure of claim 13, wherein a surface of the submount is reflective.

20. A method of manufacturing an electrical circuit, the method comprising:

obtaining a mounting structure having a substantially constant resistance over a voltage range including: an operating voltage range for an electronic device and a voltage present across the electronic device due to an electrical surge, the mounting structure comprising a bulk conductive semiconductor material having a substantially constant resistance over the voltage range; and electrically connecting the electronic device to the mounting structure using a pad, wherein the mounting structure protects the electronic device from the electrical surge without using any circuit elements selected from the group consisting of: diodes, capacitors, inductors, and resistors for the protection.

21. The method of claim 20, further comprising electrically connecting the mounting structure and the electronic device to a power source, wherein the mounting structure is connected in parallel with the electronic device to the power source.

22. The method of claim 20, wherein the mounting structure dissipates thermal energy from the electronic device.

23. The method of claim 20, wherein the mounting structure includes a reflective surface.

* * * * *